(12) United States Patent
Hubbell

(10) Patent No.: US 6,501,634 B1
(45) Date of Patent: Dec. 31, 2002

(54) HIGH VOLTAGE TRANSIENT VOLTAGE SURGE SUPPRESSION FUSE LINK SYSTEM

(76) Inventor: Douglas P. Hubbell, 5118 N. Northwood Dr., Spokane, WA (US) 99212

( * ) Notice: Subject to any disclaimer, the term of this patent is extended or adjusted under 35 U.S.C. 154(b) by 0 days.

(21) Appl. No.: 09/335,802

(22) Filed: Jun. 17, 1999

(51) Int. Cl.7 .................................................. H02H 9/04
(52) U.S. Cl. ........................ 361/124; 361/127; 361/103
(58) Field of Search .............................. 361/54, 56, 57, 361/111, 117, 118, 124, 127, 103

(56) References Cited

U.S. PATENT DOCUMENTS

| | | | |
|---|---|---|---|
| 3,492,534 A | 1/1970 | Szeremy et al. ........... 317/61.5 |
| 3,539,961 A | 11/1970 | Worthington ............... 337/197 |
| 4,288,833 A | 9/1981 | Howell ........................ 361/124 |
| 4,333,121 A | 6/1982 | Schwarz ...................... 361/104 |
| 4,494,104 A | * 1/1985 | Holmes ........................ 337/403 |
| 4,547,830 A | 10/1985 | Yamauchi ................... 361/104 |
| 4,616,286 A | * 10/1986 | Breece ........................ 361/56 |
| 4,860,155 A | 8/1989 | Wright ........................ 361/111 |
| 4,922,366 A | 5/1990 | Van Dick .................... 361/56 |
| 4,945,398 A | 7/1990 | Kurita et al. ................ 357/74 |
| 5,010,438 A | * 4/1991 | Brady ......................... 361/56 |
| 5,483,409 A | 1/1996 | Heidorn et al. ............. 361/119 |
| 5,526,218 A | 6/1996 | Yoshioka et al. ........... 361/119 |
| 5,627,711 A | 5/1997 | Pezzani ....................... 361/56 |
| 5,790,360 A | * 8/1998 | Ryan .......................... 361/111 |
| 5,808,850 A | 9/1998 | Carpenter, Jr. ............. 361/127 |
| 6,055,147 A | * 4/2000 | Jeffries et al. .............. 361/103 |

* cited by examiner

*Primary Examiner*—Kim Huynh
(74) *Attorney, Agent, or Firm*—Wells St. John P.S.

(57) ABSTRACT

A high voltage transient surge suppression system which provides an improved fusing to greatly reduce or eliminate the chance of secondary combustion during an excess power situation. The invention discloses a fuse link system which places one or more fuse links between a first electrical potential and a second electrical potential, and which uses air to insulate or isolate electrical potentials so that products of combustion from an excess power surge do not form a conductive path between electrical potentials on a printed circuit board.

34 Claims, 15 Drawing Sheets

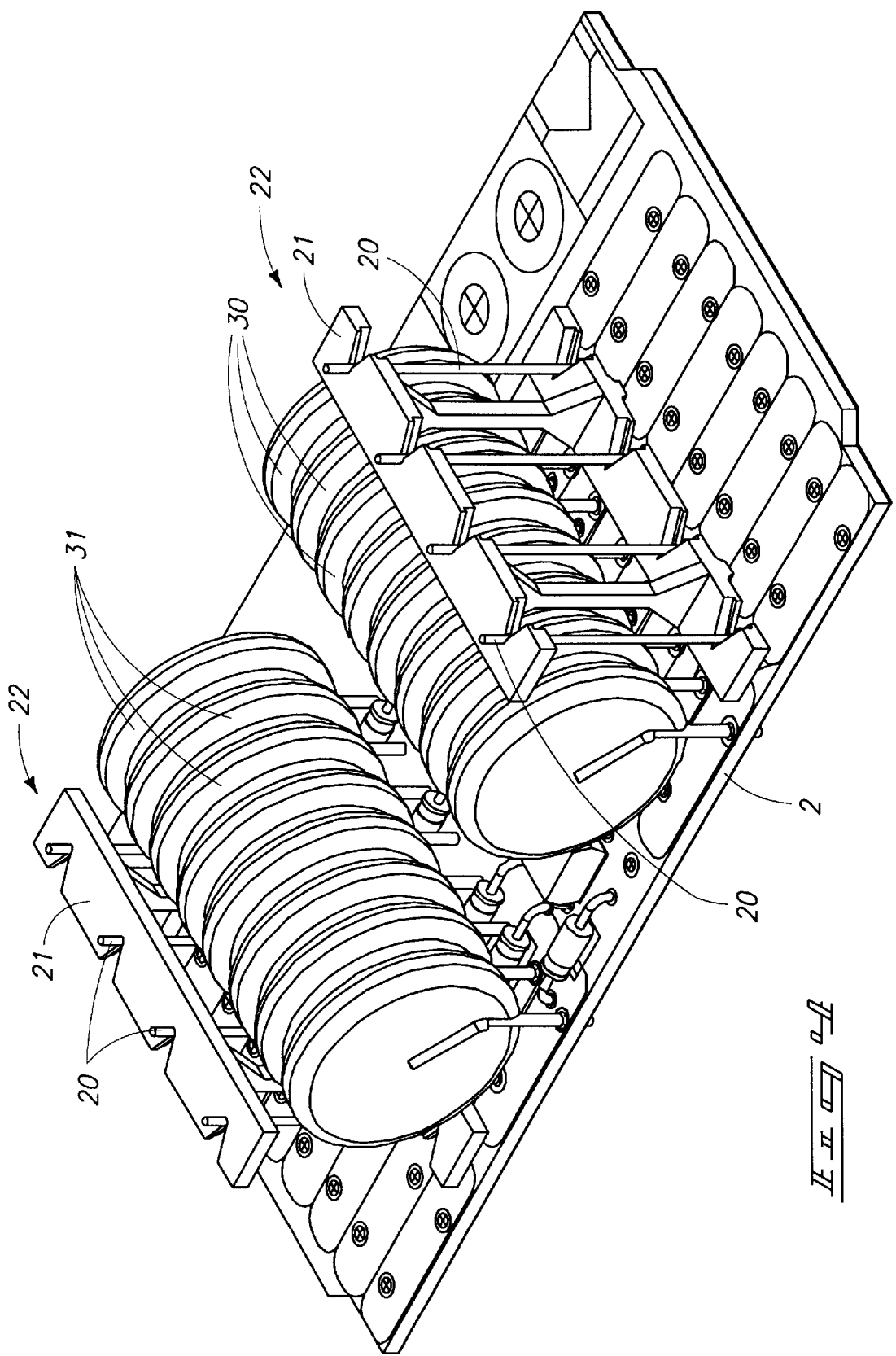

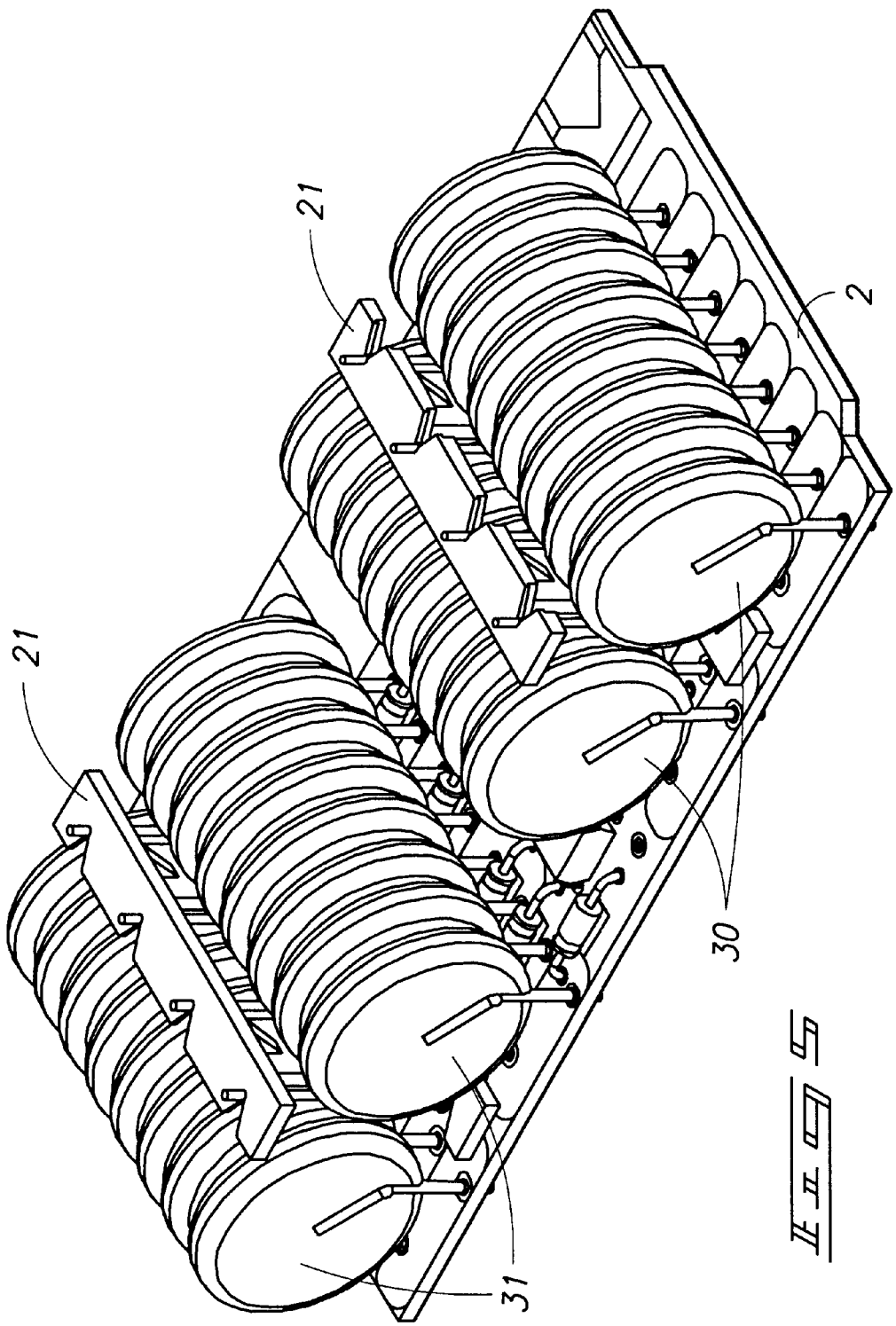

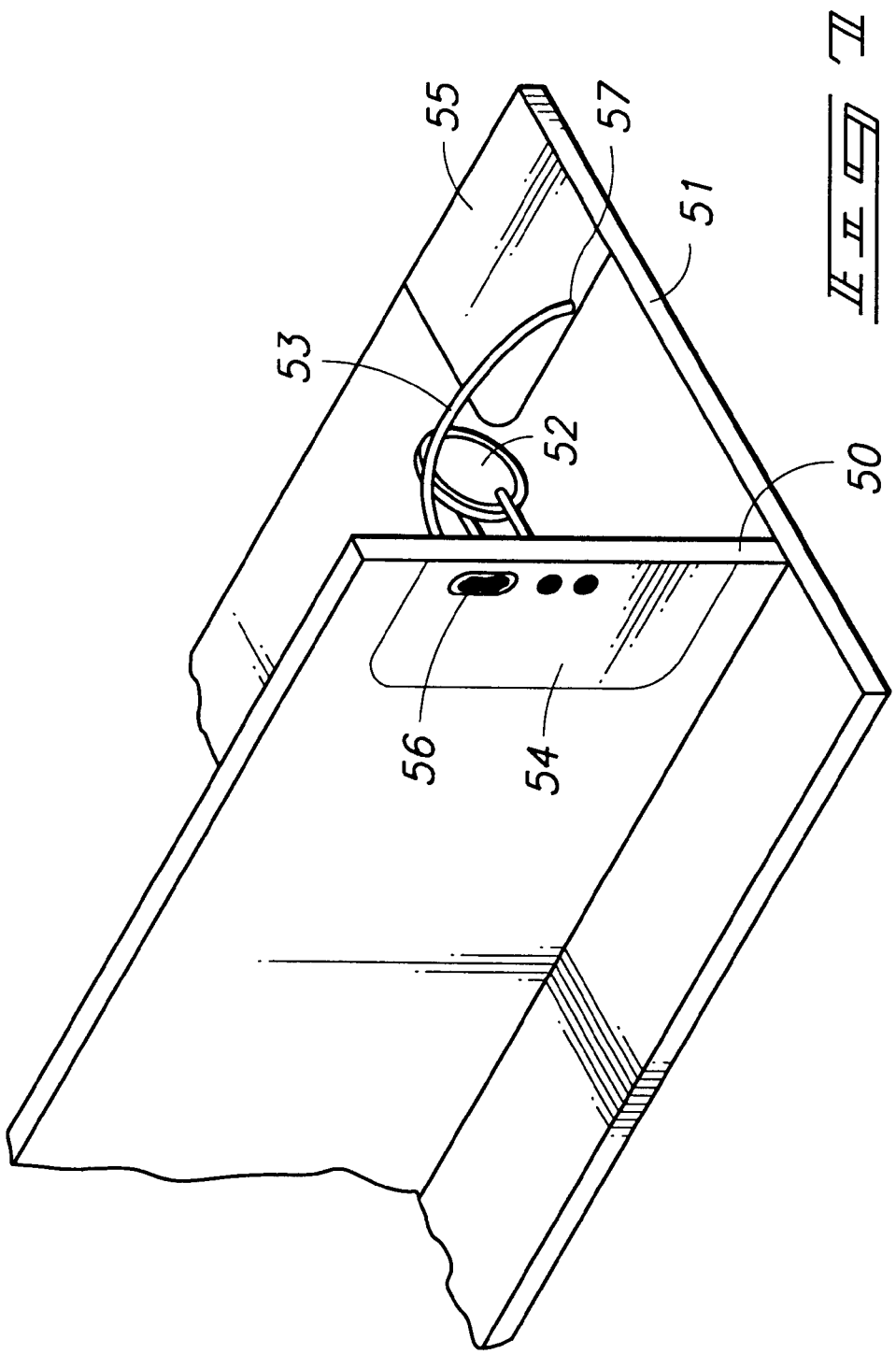

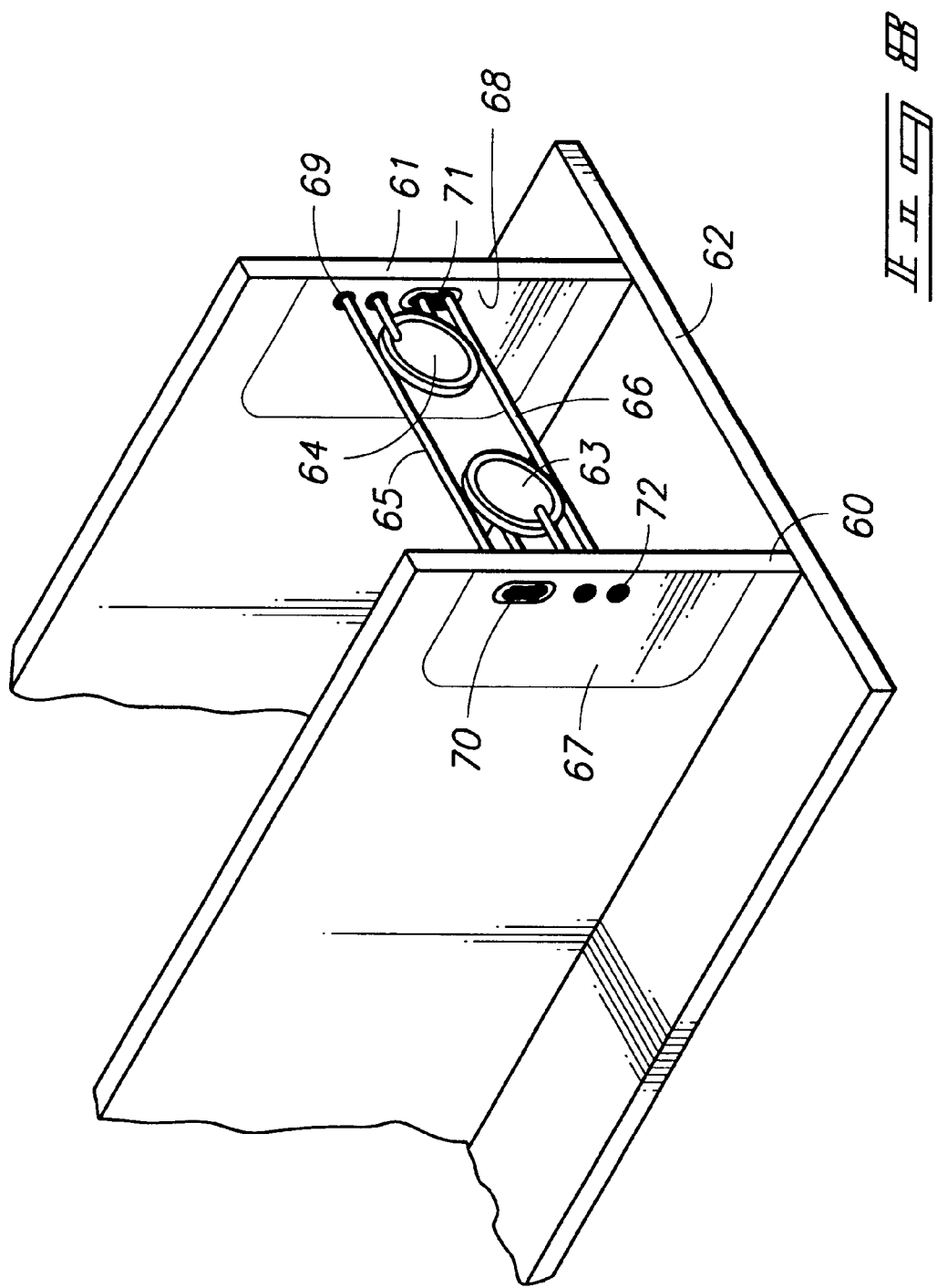

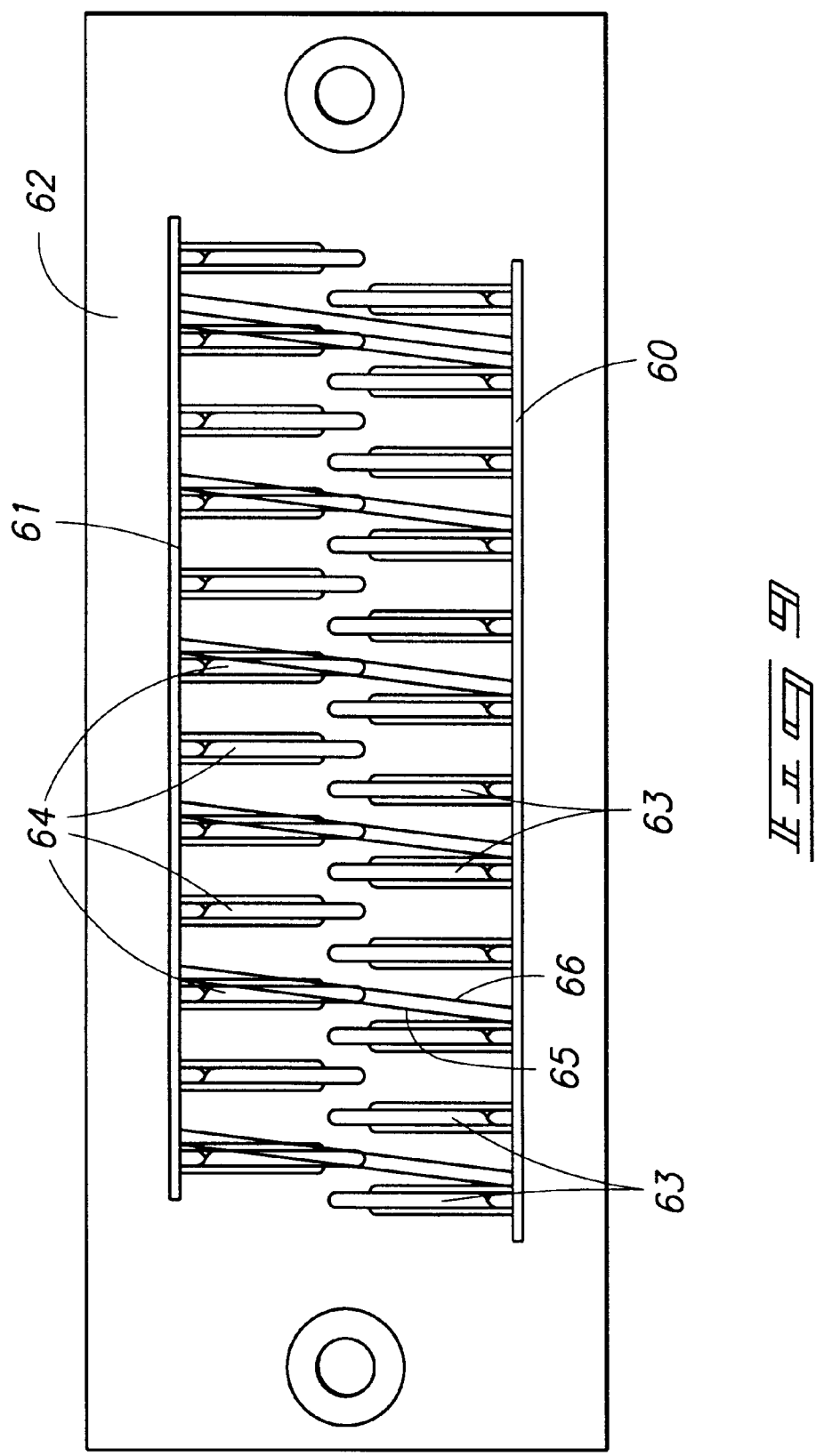

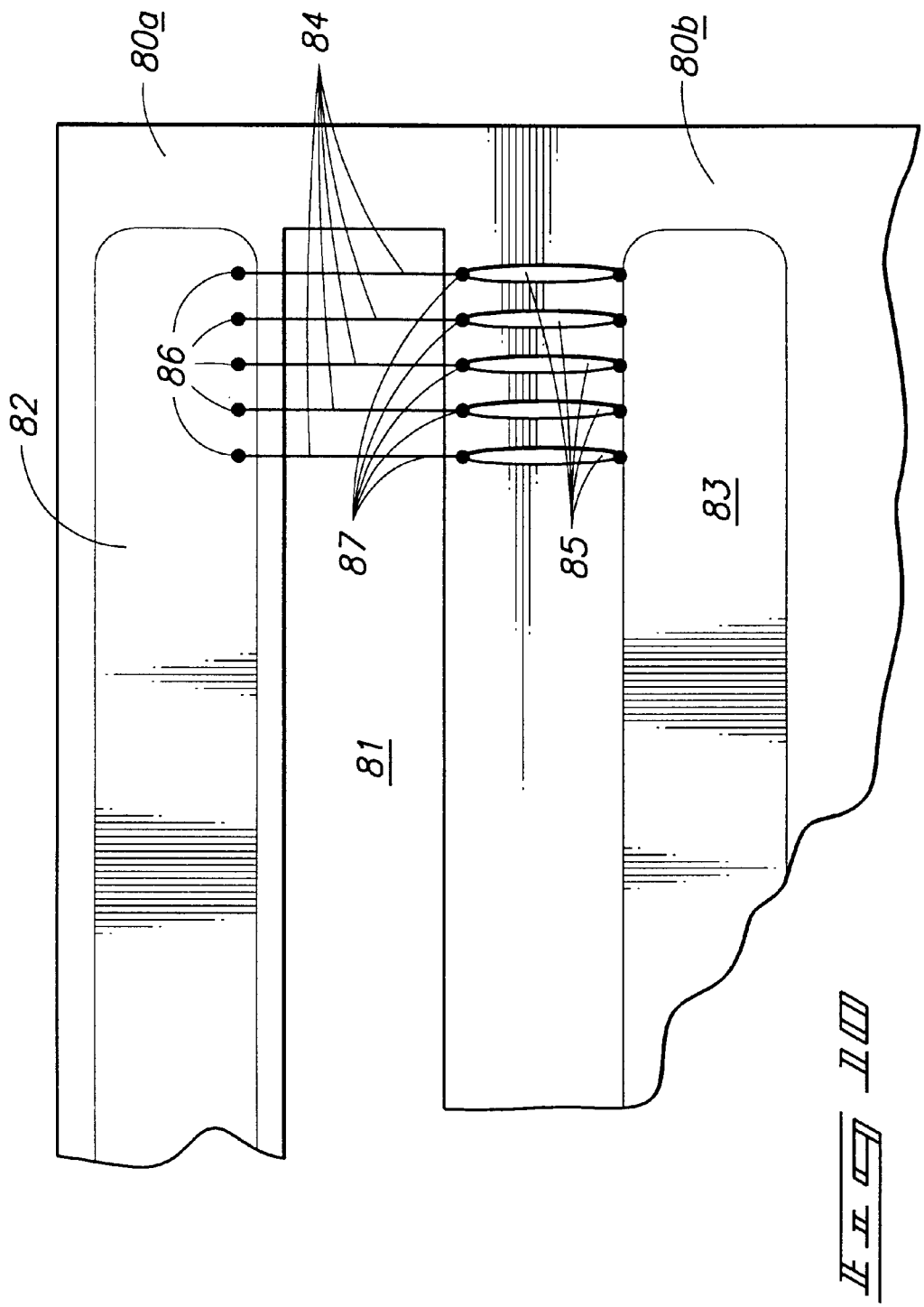

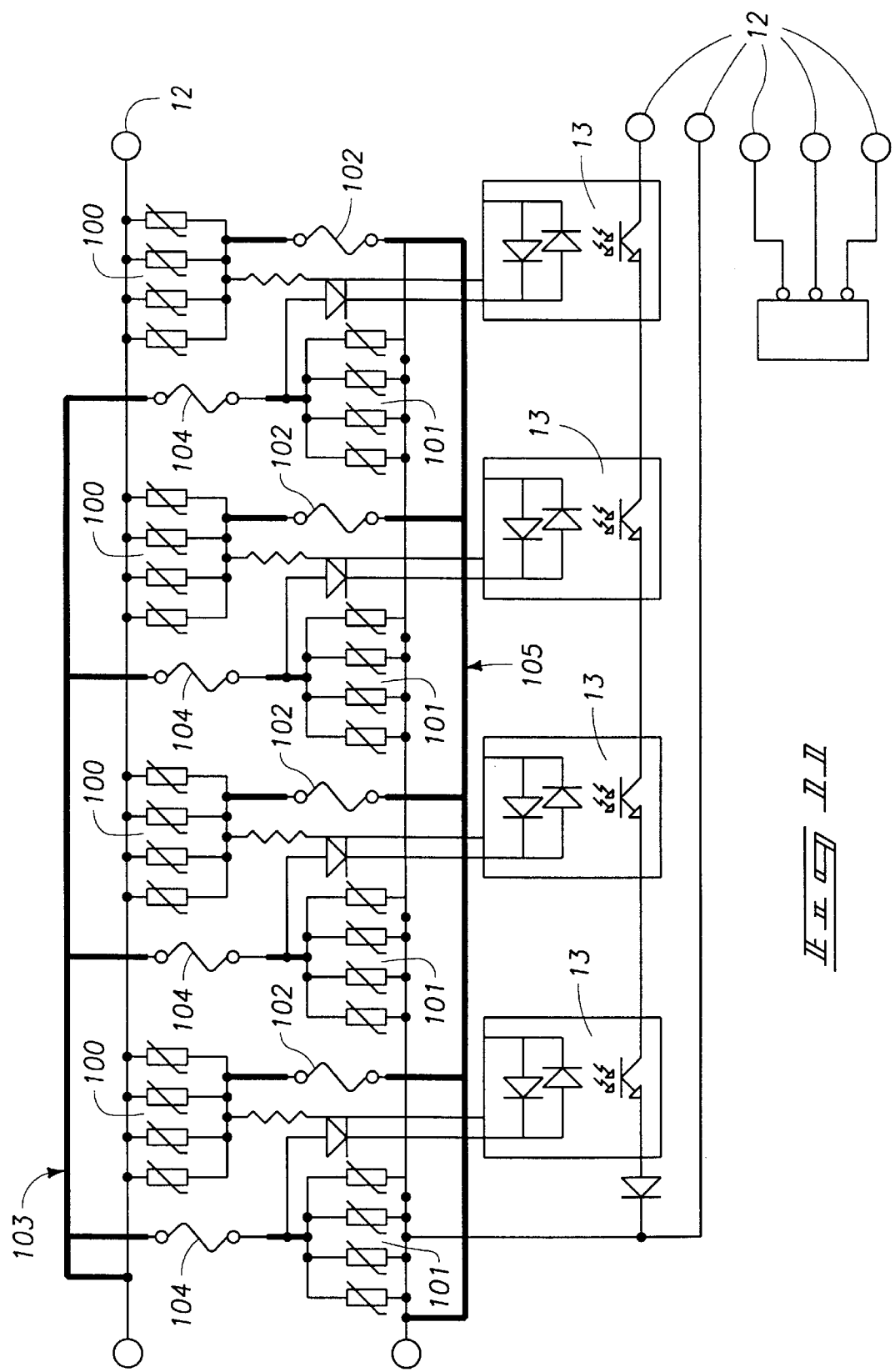

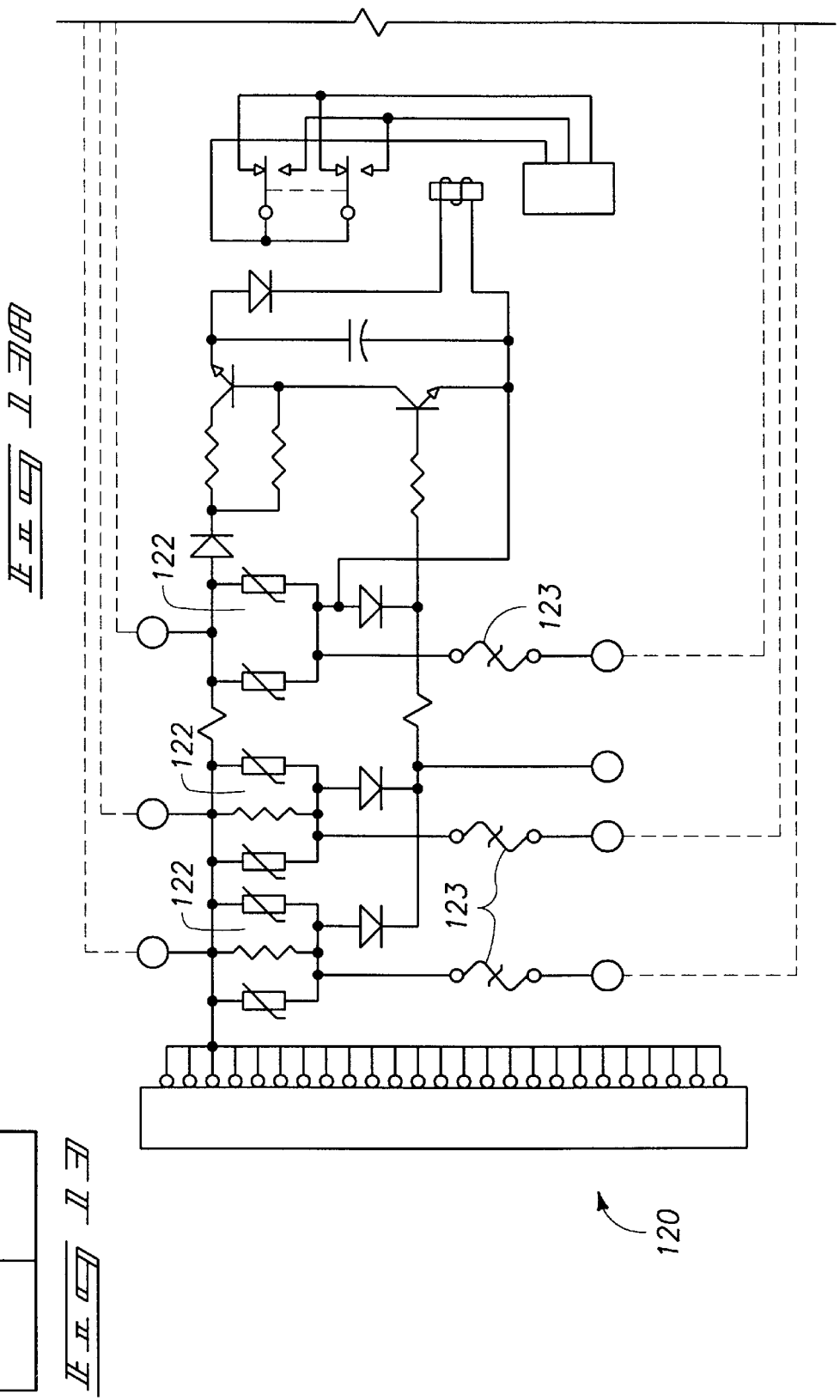

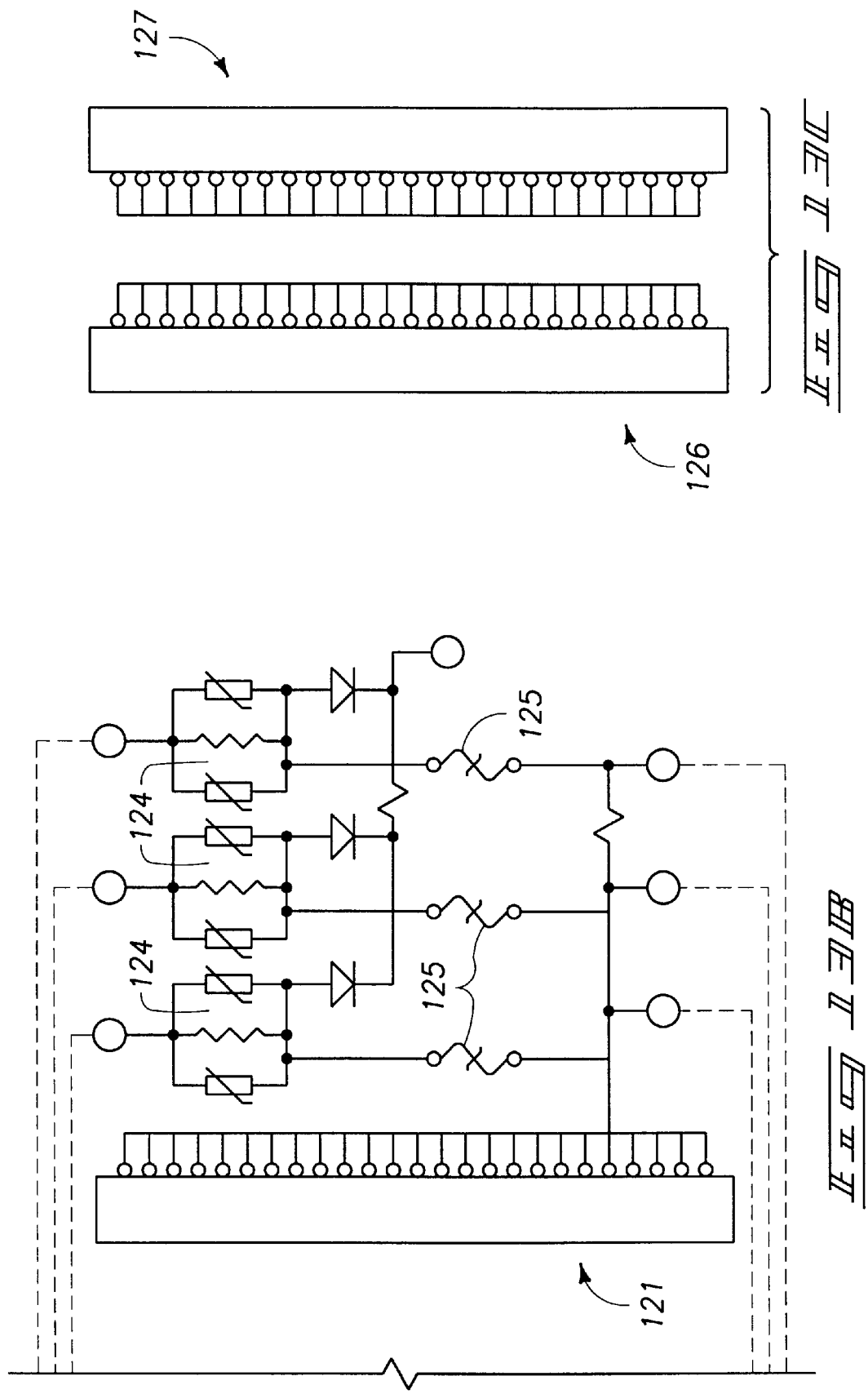

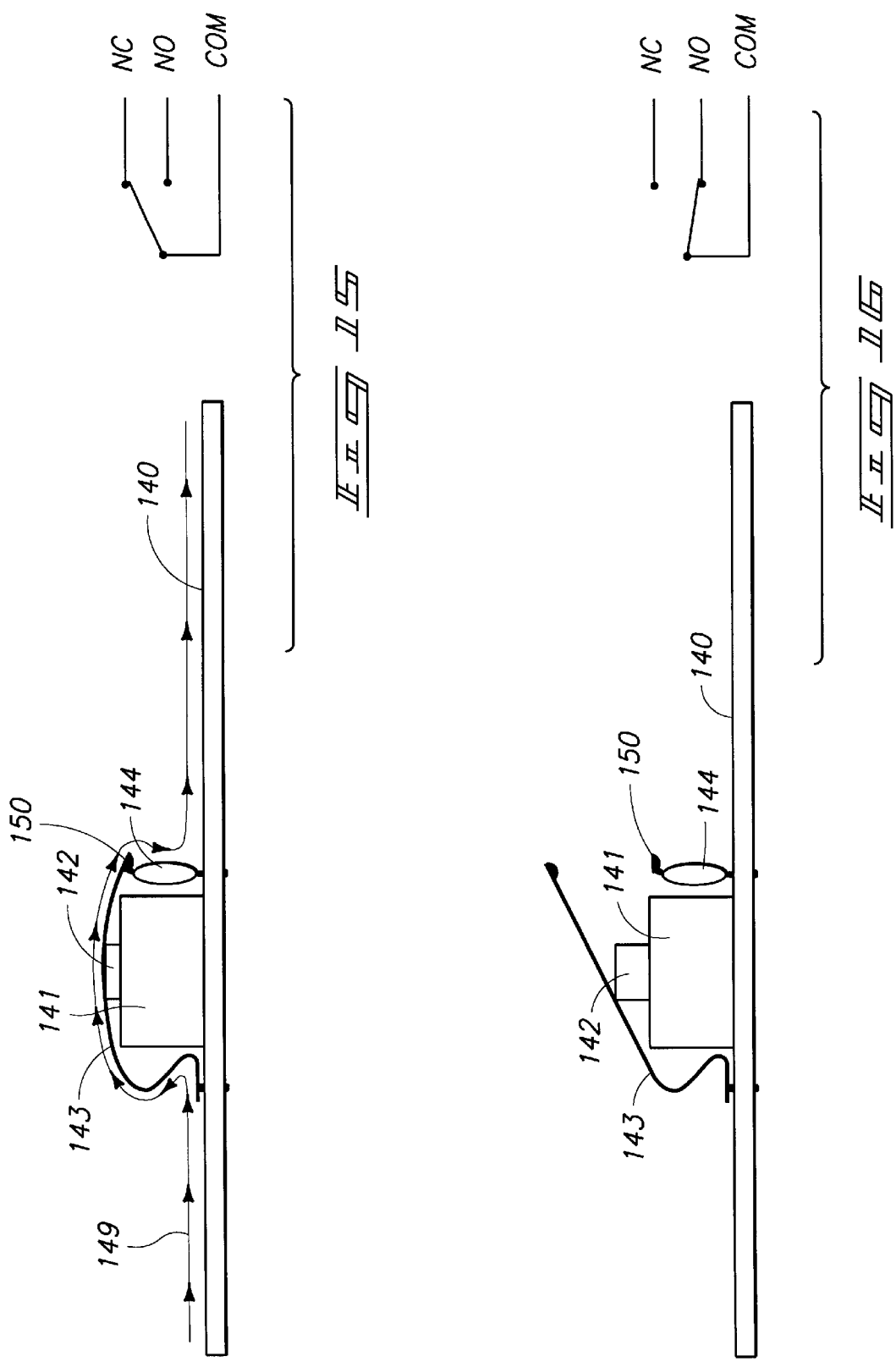

HIGH VOLTAGE TRANSIENT VOLTAGE SURGE SUPPRESSION FUSE LINK SYSTEM

TECHNICAL FIELD

The present invention relates to a fuse link system for Transient Voltage Surge Suppression (TVSS) devices, namely one which utilizes a fuse link system to provide the effective removal of electrical potential across a circuit component after a component failure.

BACKGROUND OF THE INVENTION

Transient Voltage Surge Suppression (TVSS) systems are placed between a power line or source of power, and electrical equipment receiving power from the source of power, to protect the equipment in the event of a transient over-voltage condition. TVSS systems typically utilize Metal Oxide Varistors (MOV's) or Silicon Avalanche Diodes (SAD's) between an Alternating Current (AC) power or phase line and a neutral or ground line, to suppress a voltage transient. A plurality of MOV's are typically mounted on a printed circuit board and the MOV's become conductive when a transient voltage is experienced. During the temporary over-voltage condition, the MOV, in its conductive state, discharges the potentially damaging transient to the neutral or ground line.

There will typically be a column and row configuration wherein one or more MOV's for example are wired in series, are electrically connected in parallel with a second plurality of MOV's wired in series. When a transient voltage is experienced, the combination of MOV's may participate in the discharge of the transient voltage to the neutral or ground line.

Fuses are typically electrically connected in series with the MOV's to provide a cutout or fuse mechanism in the event that an MOV's limits are exceeded and the MOV fails, and in order to prevent significant damage to all of the MOV's when only some are affected. Such fuses are designed or intended to prevent heating of the surge suppression device and the printed circuit board, and ignition thereof. Typical off-the-shelf fuses will not work adequately with heavy duty surge suppression circuits because of the high transient currents that surge components are capable of diverting. A typical twenty millimeter (20 mm) diameter MOV is capable for instance of diverting approximately twelve thousand (12,000) amperes during an industry (Institute of Electrical & Electronics Engineers "IEEE") standard 8/20 microsecond pulse.

In high energy operating environments, the limits of MOV's may be exceeded or far exceeded, causing some MOV's to fail short and burn. Since the failure mode for typical TVSS surge suppression components is low impedance and they are typically placed across the line (from phase or power to neutral or ground), high fault currents and arcing will result.

If the TVSS system is designed with fuses to take full advantage of the current capabilities of the surge suppression devices, the fuses will have to survive the same large current transient pulse that the surge suppression devices are designed to survive. A fuse sized to accomplish this task will have a high steady state current rating that may not open in time during a fault condition to keep upstream breakers from tripping.

If the fuses are sized to keep any upstream breakers from tripping they will open during transient conditions which have less magnitude than what the suppression devices are designed to withstand. This type of fuse coordination will take surge suppression devices off line that are not damaged therefore reducing the overall capabilities of the system. Since the fuse as well as the surge suppression device will be the limiting factor in the overall energy rating of the device many fuses will be required and therefore the size and cost of the fuses will be prohibitive.

The high fault currents or arcing cause high temperatures, which in turn cause most material in the vicinity of the fault (including the MOV's) to combust.

A high transient current therefore creates unusual environmental conditions and concerns that typical electrical fuses are not sufficient to handle. Further contributing to the difficult operating and performance environment for higher energy TVSS systems is that such TVSS systems are typically placed or contained in a housing, so that products of combustion are contained or substantially contained within the housing. The needs of customers is driving the size requirements of the TVSS system to smaller and smaller sizes, which further contributes to the problem.

While circuit boards provide insulating functions during many applications and conditions, they do not reliably provide sufficient and 5 reliable insulating capabilities in the unique situation presented by high energy TVSS systems during a failure condition, at least in the proximity near the fuses and/or near the surge suppression devices or components. Circuit boards which inherently have a potential from one section of the circuit board to another, provide a surface or platform for the products of combustion to create a conductive path leading to unwanted additional damage to the TVSS system.

A fuse system is required to allow the components to survive a significant transient current, typically at lease 8,000 ampere (in the 8/20 industry standard test), but which will clear or open in the even of a is fault without tripping any feeding breakers or causing a fire/smoke/heat hazard. Since each system is typically comprised of multiple high current components, there will preferably be multiple fuses.

There have been prior fusing methods attempted, such as small traces which feed suppression elements. However, the products of combustion deposited on the printed circuit board during the clearing of the fuse trace may create a path on the printed circuit board through which current will continue to travel due to the close proximity of the fuse traces to or on the surface.

Embodiments of this high voltage transient voltage surge suppression fuse link system are therefore intended to provide an improved surge suppression fuse system which greatly reduces or eliminates some of the forenamed problems in fusing systems which provide fusing across a potential which is all located on a single circuit.

There is also a need to provide an alarm to the operator of said systems if the system becomes partially inoperable or if some or all of the surge suppression devices have become inoperable or destroyed.

When a fault condition is encountered in a TVSS system, after one or more of the fuses or fuse links opens, it is desirable that the surge suppression system signal to the user or operator that a reduced suppression condition is present, so that corrective action may be taken or planned. The signalling of a condition is typically accomplished by a switch which is either energized or de-energized when the one or more fuse links is lost. The switch output is typically a Form C type of switch which will change state when the alarm system is energized or de-energized.

Any one of a number of known remote monitoring systems may be used to access the Form C switch via a three pole terminal block located on the surge suppression circuit.

The surge suppression industry is moving toward smaller and smaller surge suppression systems and the amount of space required by each component, including the switch, is becoming more and more critical.

It is also a design criteria or goal that said switch minimize the heat contributed to the surge suppression system during normal operations. For this and other reasons, a lower power miniature relay is usually the design choice for surge suppression systems, because larger relays result in unnecessary heat.

Low power miniature relays typically employ a small permanent magnet internal to the relay, the use of which creates issues and problems since the relays are expected to operate in magnetic fields of varying intensity, including some very strong magnetic fields. For example, a larger magnitude transient may be ten thousand (10,000) amperes or greater. A strong magnetic field may weaken the internal magnet in the relay and under certain conditions, may render it inoperable.

The elimination of the magnets from the alarm system makes the alarm and signaling system more reliable and eliminates the effect of magnetic fields on the system.

BRIEF DESCRIPTION OF THE DRAWINGS

Preferred embodiments of the invention are described below with reference to the accompanying drawings, which are briefly described below.

FIG. 4 is a front perspective view of a printed circuit board with surge suppression devices mounted thereon, and with fuse link modules mounted thereon;

FIG. 5 is a front perspective view of a printed circuit board with fuse link modules mounted between rows of surge suppression devices mounted on the circuit board;

FIG. 6 is a rear perspective view of an embodiment of the assembled surge suppression system;

FIG. 7 is a perspective view of a partial depiction of a two board embodiment contemplated by this invention;

FIG. 8 is a perspective view of a partial depiction of a three board embodiment contemplated by this invention;

FIG. 10 is a top view depiction of an embodiment of the invention which includes a printed circuit board with an insulating air hole or gap in it;

FIG. 11 is an electrical schematic diagram of an electrical circuit which may be used for surge suppression, more particularly, for the surge suppression system illustrated in FIGS. 1 & 2;

FIG. 13 is an electrical schematic drawing of a surge suppression circuit which may be used for the three board embodiment of the invention as illustrated in FIGS. 8 or 9, broken into FIGS. 13A, 13B and 13C;

FIG. 15 is an elevation view depiction of an embodiment of a switch or alarm system contemplated by this invention, in the normally closed position; and FIG. 16 is an elevation view depiction of an embodiment of a switch system contemplated by this invention, in the open or alarm position.

DETAILED DESCRIPTION OF THE PREFERRED EMBODIMENTS

Figure 1A:
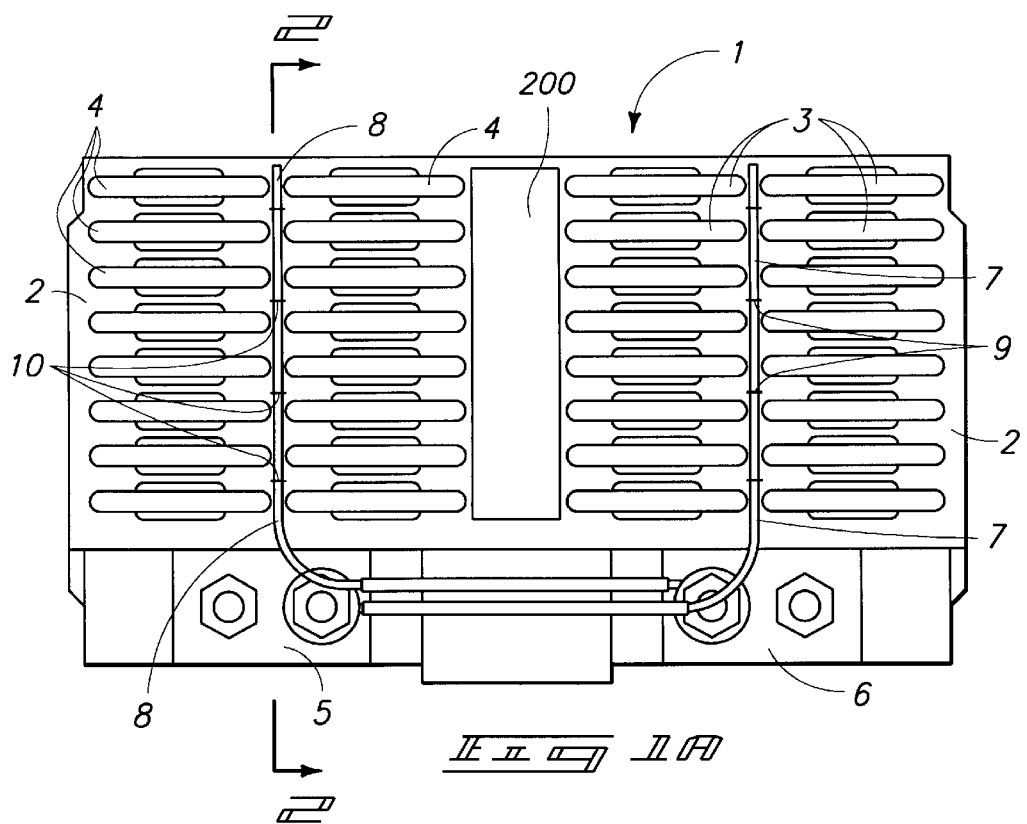
FIG. 1A is a top view of one embodiment of a surge suppression system contemplated by this invention.

Many of the fastening, connection, manufacturing and other means and components utilized in this invention are widely known and used in the field of the invention described, their exact nature or type is not necessary for an understanding and use of the invention by a person skilled in the art or science, and they will not therefor be discussed in significant detail. Furthermore, the various components shown or described herein for any specific application of this invention can be varied or altered as anticipated by this invention and the practice of a specific application of any element may already be known or used in the art or by persons skilled in the art or science and each will not therefor be discussed in significant detail.

The terms "a", "an" and "the" as used in the claims herein, are used in conformance with longstanding claim drafting practice and not in a limiting way. Unless specifically set forth herein, the terms "a", "an" and "the" are not limited to one of such, but instead mean "at least one".

The term "high voltage" as used herein is generally defined to be voltages of fifty (50) volts or higher. This invention may be used in systems in which the current may be alternating current ("A.C.") or direct ("DC").

An electrical potential may be without limitation, included in a bus, a trace, a lug, a wire or other conductor, depending on the desired mounting location and particular embodiment being employed, all within the contemplation of this invention.

Embodiments of this invention utilize air as the best insulator between the ends of fuses, or between the contact points of the fuse ends, on a surface, to avoid creating a conductive path by the deposition of products of combustion on the surfaces.

FIG. 1 is a top view of one embodiment of a surge suppression system 1 contemplated by this invention, illustrating a printed circuit board 2, a first set or plurality of surge suppression devices 3 on a first section of the printed circuit board 2, and a second set or plurality of surge suppression devices 4 on a second section of the printed circuit board 2.

As mentioned above, the surge suppression devices 2 are well known, as are numerous circuitry configurations which may be employed in a surge suppression circuit. Typically power buses are laminated onto the printed circuit board and electrically connected to the surge suppression devices through the mounting of the legs through to buses. There are typically rows and columns of surge suppression devices, the rows being electrically connected in series to one another, and electrically connected in parallel with other columns of surge suppression devices. The electrical connections are normally made through traces, buses or conductors within or on the printed circuit board, all being well known in the art and as technology develops, as no one type is necessary to practice this invention.

In the preferred embodiment of this invention, the surge suppression devices 4 are MOV's, but they need not be as there are other types such as SAD's and possibly others which may be partially or wholly utilized within the scope of this invention, as will be appreciated by those skilled in the art, as no one type is necessary to practice this invention.

FIG. 1A shows a first electrical bus 7 or wire, mounted to and supported by lug 5 above a first section (in this example, on the readers right side) of the printed circuit board 2. The first electrical bus 7, elevated above the first section of the printed circuit board represents the first electrical potential. A second electrical potential or bus 16 would be on, or traced in, the first section of the printed circuit board. The bus represents the second electrical potential and may be electrically connected to the surge suppression devices 3, in any one of the many ways which are well known in the art. Item 200 in FIG. 1A is where the alarm system described below may be located.

In the embodiment shown, the third electrical bus 8, is at the same electrical potential as the bus 16 traced in or laminated on the first section of the printed circuit board 2. The third electrical bus 8 is mounted above the printed circuit board 2 by lug 6, in similar fashion to the mounting of the first electrical bus 7. The first electrical bus 7 and the third electrical bus 8 may take numerous different forms within the contemplation of this invention, such as conductor wire, bus bar and others, as will be appreciated by those skilled in the art, as no one type is necessary to practice this invention.

Figure 2:
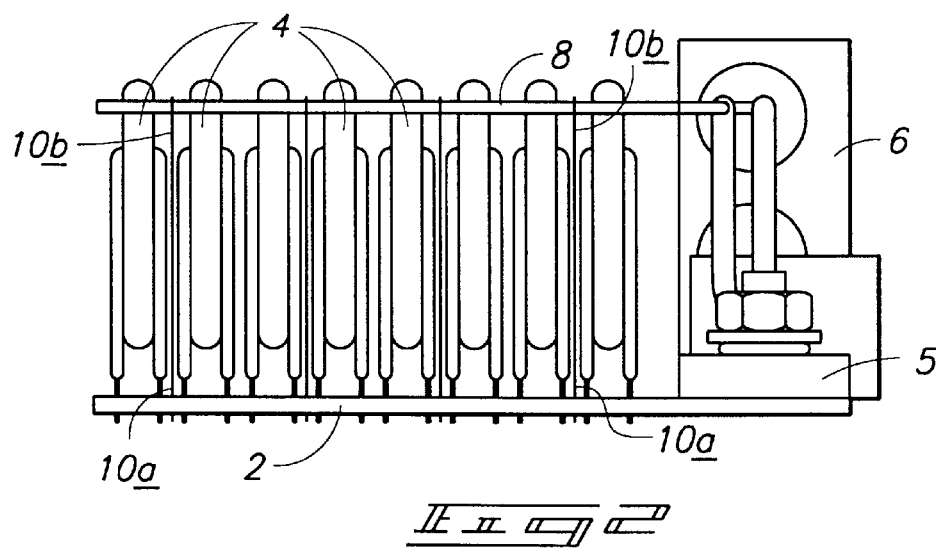
FIG. 2 is a side section view 2—2 of the embodiment of this invention as shown in FIG. 1A.

A fourth electrical bus 15 may be traced in the second section of the printed circuit board (below third electrical bus 8) and electrically connected to the surge suppression devices 4, in any one of the many ways which are well known in the art. In the preferred embodiment, the first electrical bus 7 and the third electrical bus 8 are conductors suspended, mounted or held above the printed circuit board 2, as illustrated in FIG. 2 and FIG. 6, and are of dissimilar electrical potentials.

FIG. 1A also shows the top of a first set of fuse links 9 and a second set of fuse links 10.

Figure 1B:
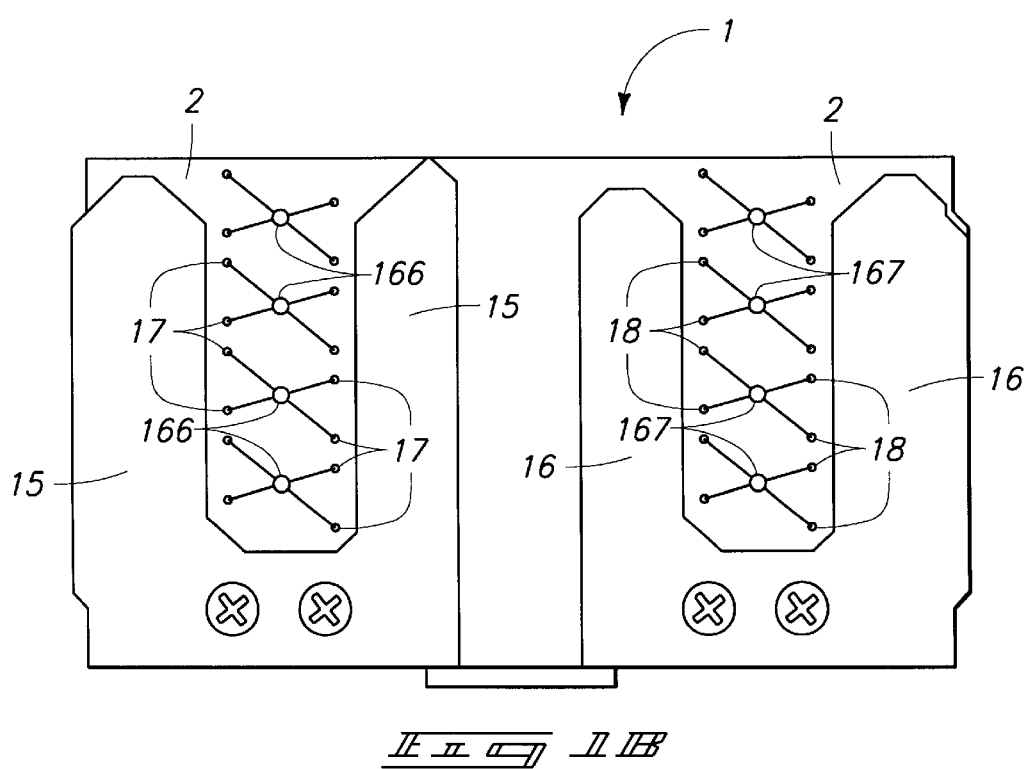
FIG. 1B is a bottom view of the embodiment of a surge suppression system shown in FIG. 1A.

FIG. 1B illustrates the bottom of the printed circuit board 2 of the surge suppression system 1, including bus 15 which is at the first electrical potential level, and bus 16, which is at the second electrical potential level. Lug 5 is electrically connected to bus 15 and lug 6 is electrically connected to bus 16.

FIG. 1B also illustrates contact points 17 for surge suppression devices 4, contact points 18 for surge suppression devices 3, which are contact points for the alternate legs of the surge suppression devices which have one leg which is electrically connected to a first electrical potential and the other which is electrically connected to the second electrical potential. Contact points 166 are for fuse links 10 and contact points 167 are for fuse links 9.

As can be better seen in FIG. 2, the fuse links in the second set of fuse links 10 are electrically connected (such as by soldering), at a first end 10b to the third electrical bus 8. A second end 10a of the fuse links 10 are electrically connected (by soldering) to contact points 166 on the printed circuit board 2, which are also electrically connected to the surge suppression devices 4.

Similarly (although not shown), the first set of fuse links 9 are electrically connected at a first end to the first electrical bus 7 and at a second end to contact points 167 on the printed circuit board 2 and to the surge suppression devices 3 thereon, as shown.

In the embodiment shown in FIG. 1, the first electrical bus 7 and the fourth electrical trace bus 15 on the second section of the printed circuit board, may be of neutral potential, and the third electrical bus 8 and second electrical trace bus 16, may be of phase power potential. As will be appreciated by those skilled in the art, the electrical potentials may be reversed such that the first electrical bus 7 and the fourth electrical bus trace 15 onto circuit board on second fly section are power phase potentials, and the third bus 8 and the second electrical trace bus 16 on the circuit board may be neutral electrical potentials.

Since there are two electrical potentials shown in this embodiment of the invention, there are numerous other combinations of potentials utilizing a neutral electrical potential, a ground electrical potential, a first phase power potential, a second phase power potential, and so on.

While it is preferred that a printed circuit board be used as shown, it is not necessary and any other type of framework may be used with the appropriate buses or conductors attached. For instance what is shown and described as a printed circuit board on FIG. 1 could instead be a framework with buses and conductor contained thereon.

FIG. 2 further illustrates that the second set of fuse links 10 have a first end 10a and a second end 10b, the first end 10a being electrically connected (by soldering in this embodiment) to contact point 166 in the printed circuit board 2, which is at the second electrical potential, the same as trace bus 16. The second end 10b of the fuse link 10 is electrically connected to the third electrical bus 8, which in this embodiment is a copper conductor, which is also at the second electrical potential.

FIG. 2 shows electrical lug 5 utilized to attach the first electrical bus 7 to the circuit board 2 and suspend it above the second section of the printed circuit board. Similarly electrical lug 6 is utilized in this embodiment to attach the third electrical bus 8 to the circuit board 2 and suspend it above the first section of the printed circuit board 2.

The first set of fuse links 9 have a first end and a second end, the first end being electrically connected by soldering to the first electrical potential in the printed circuit board, the same way described with respect to the second set of fuse links 10, as set forth above.

It should be noted that while it is preferred to utilize a printed circuit board for this invention, it is not necessary as a mount structure may be used with electrical buses mounted or otherwise imparted thereon, instead of using bus traces in a printed circuit board.

Figure 3:
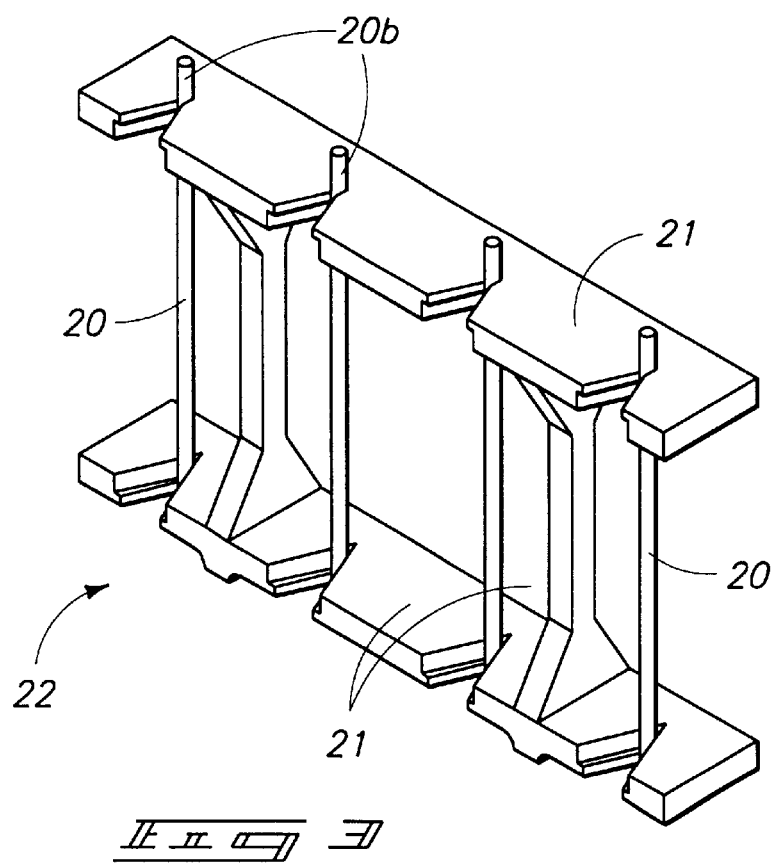
FIG. 3 is a perspective view of a fuse link module, with a fuse link structure and fuse links mounted therein.

FIG. 3 illustrates a fuse link module 22 which may be utilized in the invention. FIG. 3 illustrates fuses 20, each with a first fuse end (not shown in FIG. 3) and a second fuse end 20b, held by fuse link structure 21. The second fuse end 20b extends beyond the fuse link structure 21, and the first fuse end similarly extends beyond the fuse link structure 21 at the opposing end thereof. Fuse link structure 21 aligns and holds the fuse links 20 in a module such that the fuse links 20 may be electrically connected to and mounted on the printed circuit board more efficiently.

An efficient method for installing the fuse links 20 is to first provide a printed circuit board with apertures corresponding to the desired or pre-determined location for the fuse links 20, and then to install or mount one or more surge suppression devices on the printed circuit board. The fuse links 20 can then be mounted into the fuse link structure 21, with the first ends and the second ends of the fuse links 20 extending beyond the fuse link structure 21 at opposing ends of the fuse link structure 21.

The fuse link structure 21, and hence the first ends of the fuse links 21, can then be placed in a pre-determined location (preferably in fuse apertures in the printed circuit board) on the printed circuit board, and electrically connected to an electrical potential on the circuit board by soldering (which is shown in FIG. 4).

FIG. 4 illustrates a printed circuit board with a plurality of surge suppression devices 30, in this case, MOV's, mounted on the printed circuit board 2. FIG. 4 shows the configuration after the fuse link modules 22 has been mounted on the printed circuit board 2. The fuse link modules 22 include the fuse link structure 21 with the fuse links 20 mounted or installed therein.

FIG. 5 illustrates the surge suppression system after additional surge suppression devices 30 & 31, have been mounted on the printed circuit board 2, around the fuse link structures 21.

FIG. 6 illustrates the surge suppression system after lugs 38 & 39 have been mounted on the printed circuit board 2, with power buses or bus bars 40 and 41 mounted to the lugs 38 & 39, and electrically connected to fuse links. The second ends of the fuse links may be soldered to the bus bars 40 & 41, or within apertures in the bus bars 40 & 41, as shown.

FIG. 7 depicts an embodiment of this invention wherein two circuit boards are utilized. In this embodiment, a first circuit board 50 is mounted in approximately perpendicular disposition to a second circuit board 51. The two circuit boards can be directly attached to one another or otherwise held in that approximate relative disposition to one another. In this embodiment, one or more surge suppression devices 52 in a surge suppression circuit may be mounted to the first circuit board 50, which would have a bus 54 on the circuit board. The bus 54 on the first circuit board 50 will have one electrical potential, phase power for example. The surge suppression device 52 will be electrically connected with the bus 54 and with fuse link 53. Fuse link 53 will be electrically connected at contact point 57 to neutral bus 55 on the second circuit board 51. The neutral bus 55 will represent a second electrical potential.

While in the embodiment shown in FIG. 7 uses a power bus 54 and a neutral bus 55, it is understood that each is merely an example of one of multiple electrical potentials which may be chosen within the scope of this invention. The surface distance from contact point 57 to contact point 56 is greater than the direct distance through the air between the two contact points 56 and 57.

FIG. 8 is a depiction of a three circuit board geometrical configuration, showing a first circuit board 60, a second circuit board 61 and a third circuit board 62. In this geometrical configuration, the third circuit board 62 need not be a circuit board, but instead could merely be a board mount (or any other structure to dispose the first circuit board relative to the second circuit board) with electrical buses otherwise mounted thereon. It is preferred to use bus traces on third circuit board 62, the details of which would be known in the art.

In FIG. 8, the first circuit board 60 contains a bus 67 of one electrical potential and the second circuit board 61 contains a bus 68 of a different electrical potential to bus 67, such as phase power and neutral for example. There are one or more surge suppression devices 63 mounted on the first circuit board 60 and electrically connected to the bus 67 thereon. Fuse link 65 is electrically connected to contact point 70, which electrically connects it to one leg of surge suppression device 63. The other end of fuse link 65 is electrically connected to bus 68 at contact point 69.

It would be similar on the second circuit board 61, with bus 68 of an electrical potential different than that of bus 67, one or more surge suppression devices 64 electrically connected to bus 68. Fuse links 66 would be electrically connected to the surge suppression devices 64 on the second circuit board 61 at contact point 71. Fuse links 66 will be connected at their other ends to bus 67 on the first circuit board 60 at contact point 72. It is apparent that the surface distance from contact point 71 to contact point 72 is greater than the direct distance through the air between the two contact points 71 and 72. The surface distance as referred to herein shall be that distance on the nearest surface other than on the fuse link between the two referenced contact points.

Figure 9:
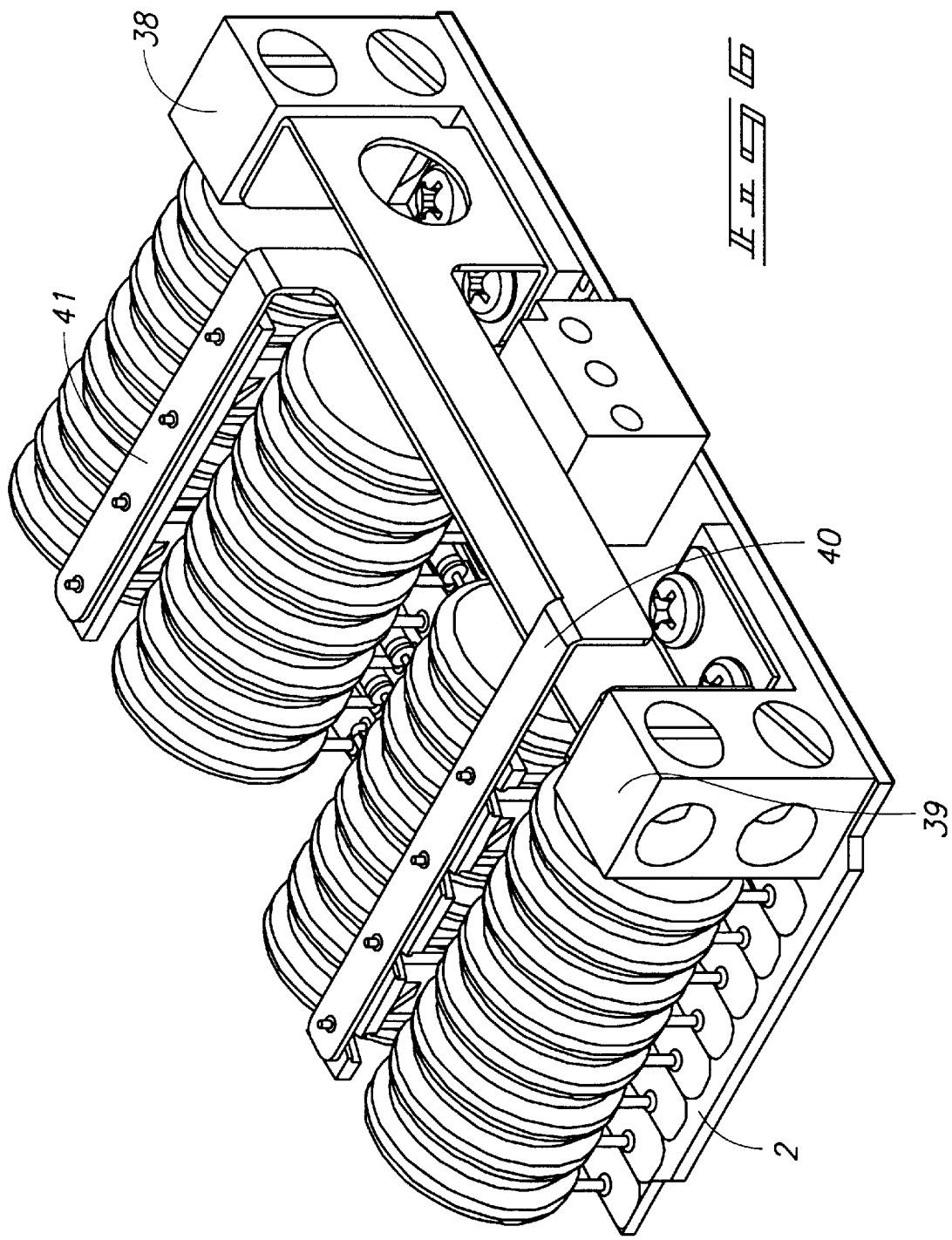
FIG. 9 is a top view of an embodiment of the invention which utilizes three circuit boards.

FIG. 9 is a top view of one embodiment of a three circuit board geometrical configuration, showing first circuit board 60, second circuit board 61, third circuit board 62, a plurality of surge suppression devices 63 mounted on first circuit board 60, a plurality of surge suppression devices 64 mounted on second circuit board 61, a plurality of fuse links 65 and fuse links 66.

FIG. 10 is an illustration of another possible embodiment of this invention, wherein the fuse links span across an air hole or gap in the circuit board, thereby greatly increasing the surface distance over which products of combustion must build up in order to form a conductive path. This greatly reduces the chances of this occurring.

FIG. 10 illustrates a printed circuit board 80, with an insulating air hole or gap 81 therein. A first end 80a of the printed circuit board is on one side of the gap 81 and a second end 80b of the printed circuit board 80 is on the opposite side of gap 81 in the printed circuit board 80. A bus 82 of one electrical potential is on the first side 80a, and bus 83 is on the opposite or second end 80b of the gap 81 in the printed circuit board 80. A plurality of surge suppression devices 85, MOV's in this case, are electrically connected to the bus 83 and to fuse links 84. Fuse links 84 have first contact points 86 and second contact points 87. The direct distance between first contact points 86 and second contact points 87 is substantially less than the surface distance between the same contacts, as can readily be seen from FIG. 10. When the term "electrically connected to the one or more surge suppression devices" is used herein, it does not require a direct contact or connection, but instead may include indirect electrical connections, such as through other electrical components like thermal disconnects, and any other types of components which may be used.

Any one of a number of known electrical schematics or surge suppression circuits may be used to accomplish the embodiment of this invention as shown in FIG. 10.

FIG. 11 is an electrical schematic drawing of one example of an electrical circuit which may be used to suppress transient voltage surges.

FIG. 11 shows a plurality of surge suppression devices 101 electrically connected to bus 105. Fuse links 104 are electrically connected at a first end to surge suppression devices 101, and electrically connected at a second end to bus 103. Bus 103 is at a different electrical potential than bus 105.

FIG. 11 also shows a plurality of surge suppression devices 100 electrically connected to bus 103. Fuse links 102 are electrically connected at a first end to surge suppression devices 100, and electrically connected at a second end to bus 105. FIG. 11 also shows opto-isolators 13 and leads 12 to FIG. 12 (shown for purposes of continuity between drawings).

Figure 12:
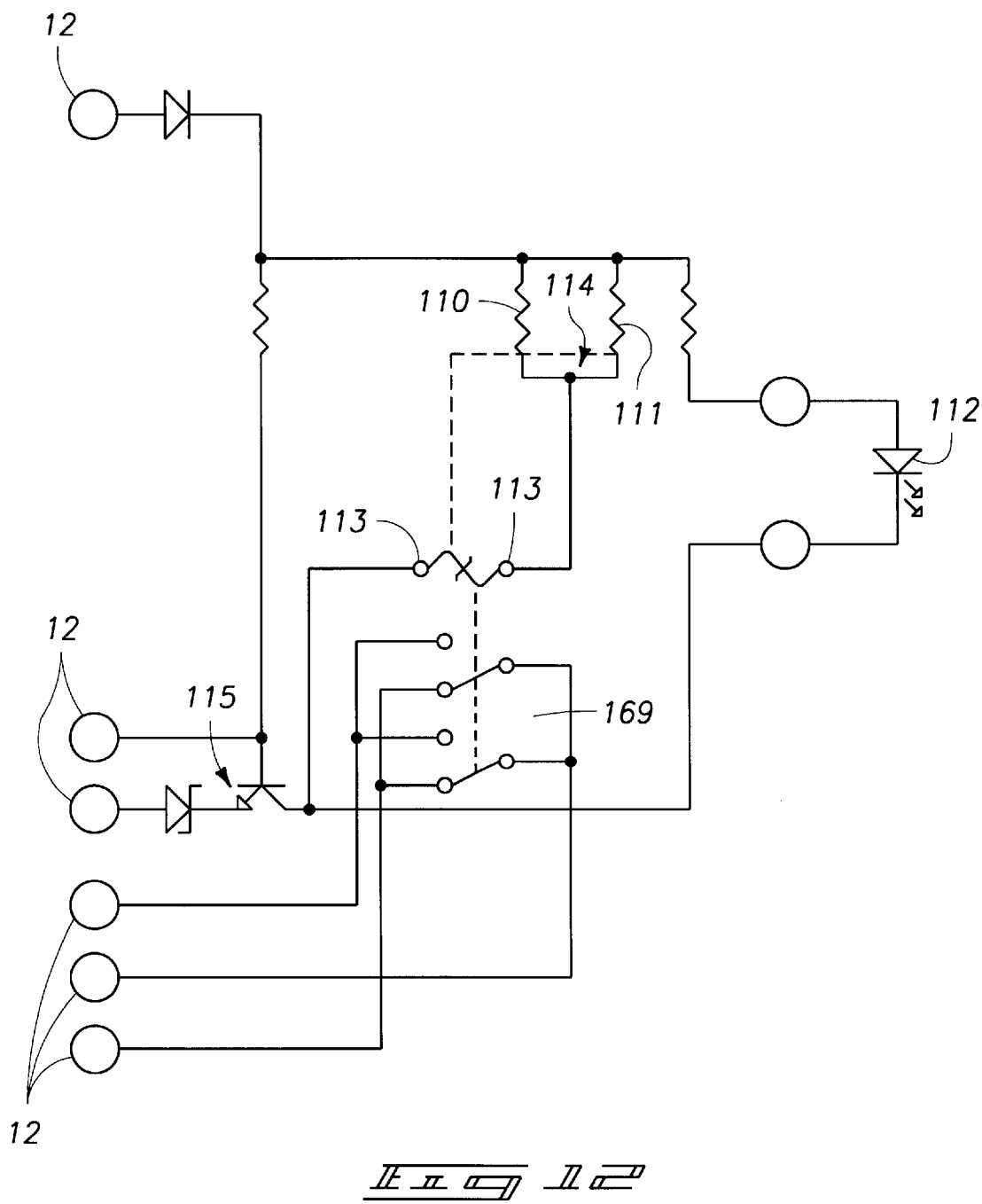
FIG. 12 is an electrical schematic diagram of an electrical circuit which may be used for an alarm relay within the contemplation of this invention.

FIG. 12 is an electrical schematic of one embodiment of an alarm system contemplated by this invention, and illustrates LED light 112, a first resistor 110 and a second resistor 111, which are each one-quarter watt resistors.

As described more fully below with respect to FIGS. 15 and 16, when current flows through the resistors 110 and 111, from the leaf spring (represented across items 113) at a sufficient level, it generates sufficient heat through the resistors to melt the solder (represented by item 114) between the leaf spring 113 and the resistor leads.

When a fault condition is detected, current is allowed to flow through the LED 112, and through the resistors 110 & 111, which causes the melting of solder 114. The melting of the solder 114 releases the solder forces holding the leaf spring 113 down. Once the leaf spring 113 is released, the switch 169 changes state and may be used to provide an alarm in addition to the LED 112 alarm, to the operator. Current through resistors 110 & 111 is interrupted when the spring is released, but the alert LED 112 stays illuminated.

FIG. 13 is an example of an electrical schematic for the three circuit board configuration of this invention, broken into FIGS. 13A, 13B and 13C.

FIG. 13A is an electrical schematic of the first printed circuit board, showing bus 120, surge suppression devices 122 on the first circuit board and fuse links 123 which span between the first printed circuit board and second printed circuit board.

FIG. 13B is an electrical schematic of the second circuit board, showing bus 121, surge suppression devices 124 on the second circuit board and fuse links 125, which span between the second printed circuit board and the first printed circuit board.

FIG. 13C is an electrical schematic of the third printed circuit board or third board, and illustrates the bus connections 126 and 127 contained thereon.

Figure 14:
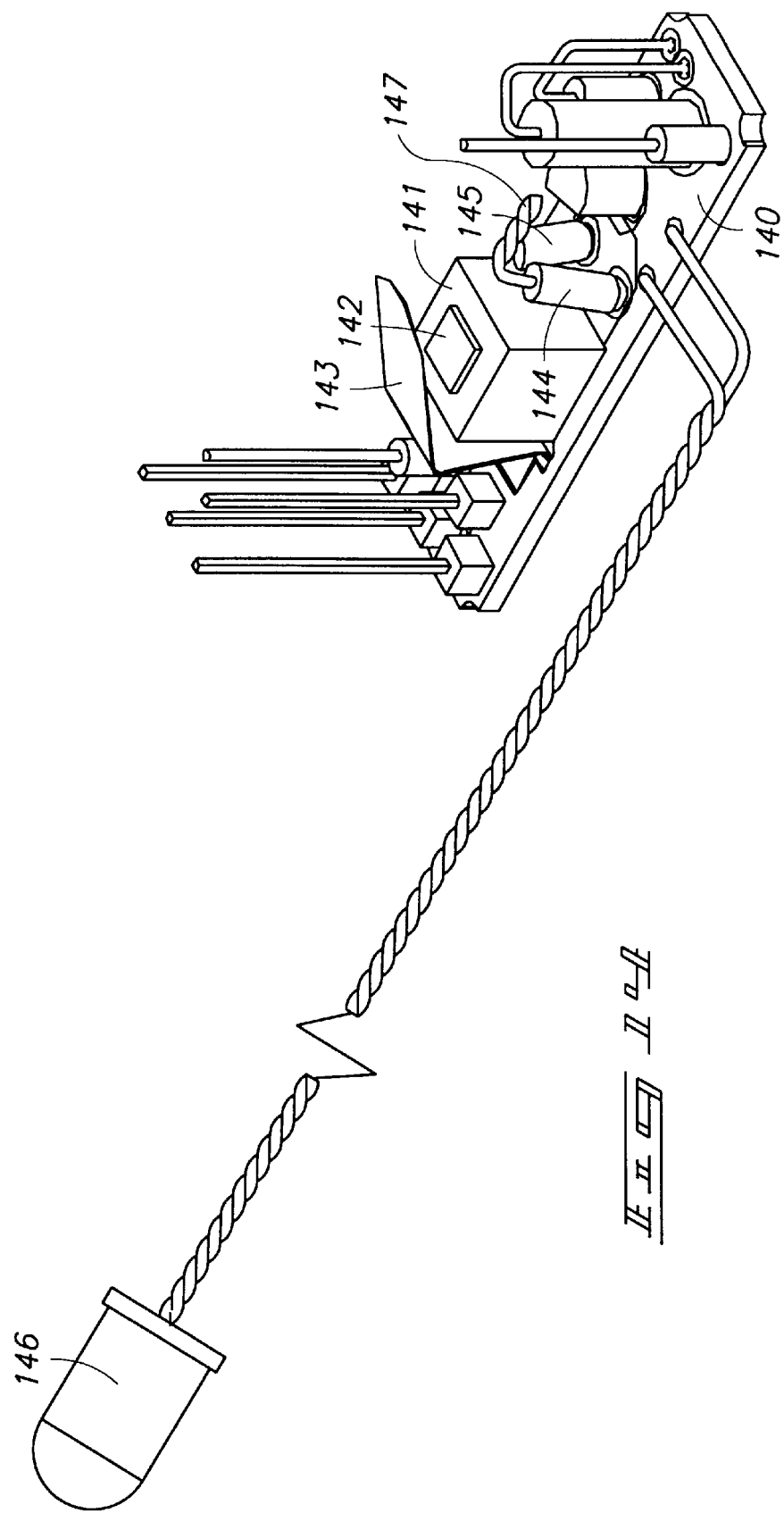
FIG. 14 is a perspective view of a switch or alarm system contemplated for use an embodiment of the surge suppression system contemplated by this invention.

FIG. 14 is a perspective view of one possible embodiment of a thermal based alarm system contemplated by this invention, illustrating leaf spring 143 (shown in the open position) over switch 141 with switch plunger 142, first resistor 144, second resistor 145 and resistor leads 147. LED 146 and printed circuit board 140 are also shown. Switch 141 is a commonly known Form C switch, which is a DPDT (double pole double throw) sub-miniature push-button switch which can be purchased from E-Switch, Brooklyn Park, MN.

As long as the leaf spring 143 remains soldered to the leads 147 of the resistors 144 & 145 (see FIGS. 15 & 16), it will hold the switch plunger 142 on the switch 141 depressed. When one or more of the fuse links are blown or lost, current will flow through leaf spring 143 and through resistors 144 & 145 and resistor leads 147 to which the leaf spring 143 is soldered. The current causes the resistors 144 & 145 (and resistor leads 147) to heat to a temperature which is beyond the melting temperature of the solder holding the leaf spring 143 to the resistor leads 147. As the solder softens and melts, it will no longer be able to hold the bias of the leaf spring 143 and the leaf spring 143 will move away from the resistors 144 & 145, thereby allowing the switch plunger 142 on the Form C switch to release outwardly and in so doing, open the circuit.

FIG. 15 is a depiction of the alarm system switch illustrating circuit board 140, leaf spring 143, switch 141 with switch plunger 142, and solder 150. FIG. 15 depicts the alarm system just after a fuse link blows (but just before the leaf spring 143 is released by the melting solder). The flow of current 149 through the resistors 144 & 145 (not visible), generates heat which melts the solder 150 and releases the leaf spring 143.

FIG. 16 is a depiction of the alarm system switch illustrating circuit board 140, leaf spring 143, switch 141 with switch plunger 142, and solder 150. FIG. 16 depicts the alarm system just after the leaf spring 143 has been released by the melting of the solder 150.

The only power this invention uses is during the short time the resistors are on (which will typically be under two minutes). When the switch plunger 142 on the Form C switch 141 is released, the Form C switch will change its state and signal the operator that the surge suppression system has been compromised or has reduced capacity to suppress a transient condition. It will be appreciated that specific components are not necessary to practice this thermal alarm system, and many are known in the art, but instead there are multiple variations and substitutes which may be employed, with no one in particular being necessary to practice this invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A high voltage transient surge suppression system, comprising:
   a. a printed circuit board;
   b. a first electrical potential on the printed circuit board;
   c. one or more surge suppression devices each mounted on the printed circuit board and electrically connected to the first electrical potential;
   d. one or more fuse links each with a first fuse link end electrically connected to at least one of the one or more surge suppression devices, and with a second fuse link end electrically connected to a second electrical potential, and a middle portion of the fuse links between the first fuse link end and the second fuse link end, said middle portion of the fuse links being unhoused, the fuse links being sized to open when the associated surge suppression device fails or in an excess power surge condition; and
wherein the middle portion of the fuse links is spaced apart from the printed circuit board.

2. A high voltage transient surge suppression system as recited in claim 1, and wherein the first electrical potential is a power potential and the second electrical potential is a neutral potential.

3. A high voltage transient surge suppression system as recited in claim 1, and wherein the first electrical potential is a neutral potential and the second electrical potential is a power potential.

4. A high voltage transient surge suppression system as recited in claim 1, and wherein the first electrical potential is a first power phase potential and the second electrical potential is a second power phase potential.

5. A high voltage transient surge suppression system as recited in claim 1, and wherein the fuse links are wire conductors.

6. A high voltage transient surge suppression system as recited in claim 1, and which further comprises a fuse module structure which holds the one or more fuse links substantially insulated from the printed circuit board by air between the first fuse link end and the second fuse link end.

7. A high voltage transient surge suppression system as recited in claim 1, and which further comprises:
   a. an alarm system which provides an alarm in response to heat generated as a result of a failure of one or more surge suppression devices.

8. A high voltage transient surge suppression system as recited in claim 1, and further wherein the fuse links are solely insulated by air surrounding the middle portion of the fuse links.

9. A high voltage transient surge suppression system, comprising:
   a. a first electrical potential;
   b. one or more surge suppression devices mounted in a framework electrically connected to the first electrical potential;
   c. one or more fuse links each with a first fuse link end electrically connected to at least one of the one or more surge suppression devices, and with a second fuse link end electrically connected to a second electrical potential, and a middle portion of the fuse links between the first fuse link end and the second fuse link end, said middle portion of the fuse links being unhoused, the fuse links being sized to open when the associated surge suppression device fails or in an excess power surge condition; and
   wherein the middle portion of each of the one or more fuse links are spaced apart from the framework.

10. A high voltage transient surge suppression system as recited in claim 9, and wherein the first electrical potential is a power potential and the second electrical potential is a neutral potential.

11. A high voltage transient surge suppression system as recited in claim 9, and wherein the first electrical potential is a neutral potential and the second electrical potential is a power potential.

12. A high voltage transient surge suppression system as recited in claim 9, and wherein the first electrical potential is a first phase power potential and the second electrical potential is a second phase power potential.

13. A high voltage transient surge suppression system as recited in claim 9, and wherein the fuse links are wire conductors.

14. A high voltage transient surge suppression system as recited in claim 9, and which further comprises a fuse module structure which holds the one or more fuse links between the first fuse link end and the second fuse link end.

15. A high voltage transient surge suppression system, comprising:
   a. a first printed circuit board;
   b. a first electrical potential on the first printed circuit board;
   c. one or more surge suppression devices each mounted on the first printed circuit board, and the one or more surge suppression devices electrically connected to the first electrical potential;
   d. a second printed circuit board mounted to the first printed circuit board;
   e. a second electrical potential on the second printed circuit board;
   f. one or more surge suppression devices each mounted on the second printed circuit board electrically connected to the second electrical potential thereon;
   g. one or more fuse links with a first fuse link end mounted at a first contact point on the first printed circuit board electrically connected to the first electrical potential, and a second fuse link end mounted at a second contact point on the second printed circuit board and electrically connected to the second electrical potential, and wherein the fuse links are each sized to open when the associated surge suppression device fails or in an excess power surge condition; and
   further wherein there is a pre-determined minimum lineal distance measured on a surface of the first printed circuit board and on a surface of the second printed circuit board between the first contact point on the first printed circuit board and the second contact point on the second printed circuit board which exceeds a pre-determined direct distance between the first contact point and the second contact point.

16. A high voltage transient surge suppression system, comprising:
   a. a printed circuit board which includes a first end on one side of an air gap in the printed circuit board, and a second end on the opposite side of the air gap;
   b. a first electrical potential on the first end of the printed circuit board;
   c. one or more surge suppression devices each mounted on the second end of the printed circuit board;
   d. a second electrical potential on the second end of the printed circuit board, and electrically connected to the one or more surge suppression devices;
   e. one or more fuse links each with a first end mounted to the first end of the printed circuit board and electrically connected to the first electrical potential, and a second end mounted to the second end of the printed circuit board and electrically connected to the one or more surge suppression devices;
   and wherein the fuse links each sized to open when the associated surge suppression device fails or in an excess power surge condition.

17. A high voltage transient surge suppression system as recited in claim 16, and wherein the first electrical potential is a power potential and the second electrical potential is a neutral potential.

18. A high voltage transient surge suppression system as recited in claim 16, and wherein the first electrical potential is a neutral potential and the second electrical potential is a power potential.

19. A high voltage transient surge suppression system as recited in claim 16, and wherein the first electrical potential is a first phase power potential and the second electrical potential is a second phase power potential.

20. A high voltage transient surge suppression system as recited in claim 16, and wherein the fuse links are wire conductors.

21. A high voltage transient surge suppression system, comprising:
   a. a first printed circuit board;
   b. a first electrical potential on the first printed circuit board;
   c. one or more surge suppression devices each mounted on the first printed circuit board, and the one or more surge suppression devices electrically connected to the first electrical potential;
   d. a second printed circuit board mounted in a fixed disposition relative to the first printed circuit board;
   e. a second electrical potential on the second printed circuit board;

f. one or more fuse links each with a first fuse link end mounted with the associated one or more surge suppression devices on the first printed circuit board, and with a second fuse link end mounted to the second printed circuit board and electrically connected to the second electrical potential; and wherein the fuse links are each sized to open when the associated surge suppression device fails or in an excess power surge condition.

22. A high voltage transient surge suppression system as recited in claim 21, and further comprising one or more surge suppression devices each mounted on the second printed circuit board and electrically connected to the second electrical potential on the second printed circuit board, and one or more fuse links each with a first fuse link end mounted with the associated one or more surge suppression devices on the second printed circuit board, and with a second fuse link end mounted to the first printed circuit board and electrically connected to the first electrical potential.

23. A high voltage transient surge suppression system as recited in claim 21, and wherein the first electrical potential is a power potential and the second electrical potential is a neutral potential.

24. A high voltage transient surge suppression system as recited in claim 21, and wherein the first electrical potential is a neutral potential and the second electrical potential is a power potential.

25. A high voltage transient surge suppression system as recited in claim 21, and wherein the first electrical potential is a first phase power potential and the second electrical potential is a second phase power potential.

26. A high voltage transient surge suppression system as recited in claim 21, and wherein the fuse links are wire conductors.

27. A high voltage transient surge suppression system, comprising:
  a. a first printed circuit board;
  b. a first electrical potential on the first printed circuit board;
  c. one or more surge suppression devices each mounted on the first printed circuit board, and the one or more surge suppression devices electrically connected to the first electrical potential;
  d. a second printed circuit board;
  e. a second electrical potential on the second printed circuit board;
  one or more surge suppression devices each mounted on the second printed circuit board, and the one or more surge suppression devices on the second printed circuit board being electrically connected to the second electrical potential on the second printed circuit board;
  g. one or more fuse links, each with a first fuse link end mounted to the first printed circuit board and electrically connected to the associated one or more surge suppression devices on the first printed circuit board, and a second fuse link end mounted to the second printed circuit board and electrically connected to the second electrical potential on the second printed circuit board;
  h. one or more fuse links, each with a first fuse link end mounted to the second printed circuit board and electrically connected to the associated one or more surge suppression devices on the second printed circuit board, and a second fuse link end mounted to the first printed circuit board and electrically connected to the first electrical potential on the first printed circuit board; and wherein the fuse links are each sized to open when the associated surge suppression device fails or in an excess power surge condition.

28. A high voltage transient surge suppression system as recited in claim 27, and wherein the first electrical potential is a power potential and the second electrical potential is a neutral potential.

29. A high voltage transient surge suppression system as recited in claim 27, and wherein the first electrical potential is a neutral potential and the second electrical potential is a power potential.

30. A high voltage transient surge suppression system as recited in claim 27, and wherein the first electrical potential is a first phase power potential and the second electrical potential is a second phase power potential.

31. A high voltage transient surge suppression system as recited in claim 27, and wherein the fuse links are wire conductors.

32. A high voltage transient surge suppression system, comprising:
  a. a printed circuit board;
  b. a power bus traced on the printed circuit board;
  c. one or more surge suppression devices each mounted on the printed circuit board and electrically connected to the power bus;
  d. one or more fuse links each with a first fuse link end and a second fuse link end and a middle portion there-between, the first fuse link end being electrically connected to the one or more surge suppression devices;
  e. a neutral bus bar in spaced disposition relative to the printed circuit board, electrically connected to the second fuse link ends, such that the middle portion of the fuse links are spaced apart from the printed circuit board and the neutral bus bar end, said middle portion of the fuse links being unhoused; and the fuse links being sized to open when the associated surge suppression device fails or in an excess power surge condition.

33. A high voltage transient surge suppression system as recited in claim 32, and which further comprises:
  a. a neutral bus traced on the printed circuit board;
  b. one or more surge suppression devices each mounted on the printed circuit board and electrically connected to the neutral bus;
  c. one or more fuse links each with a first fuse link end and a second fuse link end, the first fuse link end being electrically connected to the one or more surge suppression devices;
  d. a power bus bar in spaced disposition relative to the printed circuit board, electrically connected to the second fuse link ends, such that the fuse links are substantially insulated from the printed circuit board by air between the first fuse link ends and the second fuse link ends.

34. A high voltage transient surge suppression system as recited in claim 32, and which further comprises:
  a. an alarm system which provides an alarm in response to heat generated as a result of a failure of one or more surge suppression devices.

* * * * *

UNITED STATES PATENT AND TRADEMARK OFFICE
CERTIFICATE OF CORRECTION

PATENT NO.   : 6,501,634 B1  
DATED        : December 31, 2002  
INVENTOR(S)  : Douglas P. Hubbell It is certified that error appears in the above-identified patent and that said Letters Patent is hereby corrected as shown below:

Column 1,
Line 53, replace "MOV's to fail short and burn. Since the failure mode for"
with -- MOV's to fail, short and burn. Since the failure mode for --

Column 2,
Line 24, replace "provide sufficient and 5 reliable insulating capabilities in the" with
-- provide sufficient and reliable insulating capabilities in the --
Line 34 replace "survive a significant transient current, typically at lease" with
-- survive a significant transient current, typically at least --
Line 36, replace "will clear or open in the even of a is fault without tripping" with
-- will clear or open in the event of a fault without tripping --
Line 63, replace "signalling of a condition is typically accomplished by a" with
-- signaling of a condition is typically accomplished by a --

Column 4,
Line 4, replace "contemplated for use an embodiment of the surge suppres-" with
-- contemplated for use in an embodiment of the surge suppres- --

Column 6,
Line 10, replace "electrical bus trace 15 onto circuit board on second fly" with
-- electrical bus trace 15 onto circuit board on second --

Column 13,
Line 49, replace "one or more surge suppression devices each mounted on" with
-- f. one or more surge suppression devices each mounted on --

Signed and Sealed this

Fifth Day of August, 2003

JAMES E. ROGAN  
*Director of the United States Patent and Trademark Office*